(12) United States Patent
Lee et al.

(10) Patent No.: US 7,142,460 B2
(45) Date of Patent: Nov. 28, 2006

(54) FLASH MEMORY DEVICE WITH IMPROVED PRE-PROGRAM FUNCTION AND METHOD FOR CONTROLLING PRE-PROGRAM OPERATION THEREIN

(75) Inventors: Hee Youl Lee, Icheon-shi (KR); Sung Jae Chung, Seoul (KR)

(73) Assignee: Hynix Semiconductor, Inc., Ichon-shi (KR)

( * ) Notice: Subject to any disclaimer, the term of this patent is extended or adjusted under 35 U.S.C. 154(b) by 2 days.

(21) Appl. No.: 11/158,463

(22) Filed: Jun. 21, 2005

(65) Prior Publication Data

US 2006/0203565 A1    Sep. 14, 2006

(30) Foreign Application Priority Data

Mar. 10, 2005   (KR) .................. 10-2005-0020189

(51) Int. Cl.
*G11C 11/24* (2006.01)
(52) U.S. Cl. ................. 365/185.29; 365/185.13; 365/185.3
(58) Field of Classification Search ............. 365/222, 365/185.29, 185.13, 185.11, 185.14, 185.3, 365/185.24, 203
See application file for complete search history.

(56) References Cited

U.S. PATENT DOCUMENTS

| | | | | |
|---|---|---|---|---|
| 5,890,193 A * | 3/1999 | Chevallier | ............ | 711/103 |
| 6,288,938 B1 * | 9/2001 | Park et al. | ............ | 365/185.08 |
| 6,356,974 B1 * | 3/2002 | Chevallier | ............ | 711/103 |
| 6,515,910 B1 * | 2/2003 | Lee et al. | ............ | 365/185.22 |
| 6,680,865 B1 * | 1/2004 | Watanabe | ............ | 365/185.26 |
| 7,035,143 B1 * | 4/2006 | Lee | ............ | 365/185.17 |

* cited by examiner

*Primary Examiner*—Son T. Dinh
*Assistant Examiner*—Hien Nguyen
(74) *Attorney, Agent, or Firm*—Townsend and Townsend and Crew LLP

(57) ABSTRACT

A flash memory device has an improved pre-program function. The flash memory device comprises memory cell blocks each including wordlines, bitlines, and memory cells sharing common source lines; an erase controller generating a pre-program control signal in response to an erase command; and a voltage selection circuit selecting one of first and second common source voltages in response to one among the pre-program control signal, a read command, and a program command and outputting the selected voltage to a global common source line.

20 Claims, 4 Drawing Sheets

FLASH MEMORY DEVICE WITH IMPROVED PRE-PROGRAM FUNCTION AND METHOD FOR CONTROLLING PRE-PROGRAM OPERATION THEREIN

CROSS-REFERENCES TO RELATED APPLICATIONS

The present application claims priority to Korean Patent Application No. 10-2005-20189, filed on Mar. 10, 2005, which is incorporated by reference.

BACKGROUND OF THE INVENTION

The present invention relates to a semiconductor memory device and method of controlling an operation thereof and specifically, to a flash memory device and method for controlling a pre-program operation.

In general, a flash memory device is operable in a read operation, a program operation, and an erase operation. The erase operation is accomplished with Fowler-Nordheim tunneling effect induced at an insulation film between a P-well and a floating gate of a memory cell. By the erase operation, data stored in all memory cells in a memory cell block are erased at a time. The erase operation is carried out in the unit of memory cell block. There would be memory cells that have been already erased (i.e., memory cells programmed with data '0'). As the pre-erased memory cells have low threshold voltages, it would produce over-erasure when the erase operation is resumed (i.e., the threshold voltages are lowered too much). Therefore, in purpose of preventing such a result, the procedure of erasing the flash memory device includes a pre-program operation to adjust the threshold voltages of the whole memory cells on a first predetermined voltage level by preliminarily programming the whole memory cells before the erase operation. Meanwhile, the erasing speed of the memory cells included in the flash memory device may vary in accordance with manufacturing process conditions. In other words, there would be memory cells with faster erasing speed and memory cells with slower erasing speed. Thus, if an erasing time is established to the memory cells with the slower erasing speed, the memory cells with the faster erasing speed may be over-erased. In order to prevent such a result, the erasing procedure includes a post-program operation to adjust the threshold voltages of the whole memory cells on a second predetermined voltage levels by conducting a program operation for the whole memory cells for a predetermined time after the erase operation.

FIG. 1 is a circuit diagram illustrating memory cell blocks and bitline selection circuits, explaining a pre-program operation in a conventional flash memory device. Referring to FIG. 1, there are disclosed memory cell blocks MR1~MRN (N is an integer) and the bitline selection circuit 10. For simplification of the drawing, there are just disclosed memory cells that are connected to a pair of bitlines BLe and BLo, among memory cells included in each of the memory cell blocks MR1~MRN. For example, while executing the pre-program operation for the memory cell block MR1, a power source voltage VCC is applied to a drain selection line DSL and a ground voltage 0V is applied to a source selection line SSL. As a result, a drain selection transistor DST of the memory cell block MR1 is turned on while a source selection transistor SST is turned off. A high voltage HVP (e.g., 15~20V) is applied to wordlines WL0~WLM (M is an integer). Thus, memory cells C0~CM of the memory cell block MR1 are turned on. And, the power source voltage VCC is applied to a common source line CSL and NMOS transistors N1 and N2 of the bitline selection circuit 10 are turned on to apply a signal VIRPWR to the bitlines BLe and BLo. During this, the signal VIRPWR has a voltage level of 0 and NMOS transistors N3 and N4 of the bitline selection circuit 10 are turned off in response to selection signals BSLe and BSLo. As a result, a great voltage gap is generated between drains and gates of the memory cells C0~CM (M is an integer), which causes injection of electrons to floating gates of the memory cells C0~CM to conduct the pre-program operation.

As aforementioned, the memory cells C0~CM are pre-programmed by the voltage of 0V applied to the bitlines BLo and BLe. Meanwhile, as the bitlines BLe and BLo are shared by all the memory cell blocks MR1~MRN, they have very large loading capacitance. Thus, it increases the time for sufficiently discharging the bitlines BLo and BLe to 0V in response to the signal VIRPWR, increasing the amount of current consumption. Further, the parasitic capacitance, under the bitlines BLe and BLo, caused by the high voltage HVP applied to the wordlines WL0~WLM acts to further increase the discharging time and current consumption. Therefore, in the pre-program operation in the conventional flash memory device, the discharging time of the bitlines BLe and BLo increases to make the whole erasing time longer and current consumption larger.

BRIEF SUMMARY OF THE INVENTION

The present invention is directed to flash memory devices. An embodiment of the present invention provides a flash memory device capable of reducing a pre-program time and current consumption by separating bitlines from memory cells and applying program bias voltages through a common source line during a pre-program operation.

Another embodiment of the present invention is directed to a method of controlling a pre-program operation in flash memory device, capable of reducing a pre-program time and current consumption by separating bitlines from memory cells and applying program bias voltages through a common source line during the pre-program operation.

An aspect of the present invention is to provide a flash memory device comprising: memory cell blocks each including wordlines, bitlines, and memory cells sharing common source lines; an erase controller generating a pre-program control signal in response to an erase command; and a voltage selection circuit selecting one of first and second common source voltages in response to one among the pre-program control signal, a read command, and a program command and outputting the selected voltage to a global common source line. Preferably, the global common source line is connected to the common source line of each of the memory cell blocks, and memory cells of the memory cell block in a pre-program operation are isolated from the bitlines but connected to the common source line, and wordline bias voltages are applied to the wordlines of the memory cells for the pre-program operation.

Another aspect of the present invention is to provide a method for controlling a pre-program operation of a flash memory device, the method comprising the steps of: generating a pre-program control signal in response to an erase command; supplying a common source voltage of a ground voltage level to a global common source line, which is connected to a common source line of each of memory cell blocks, in response to the pre-program control signal; selecting one or a part of the memory cell blocks in response to a row address signal; connecting memory cells of the selected memory cell block(s) to the common source line from bitlines; and supplying wordline bias voltages, for a pre-program operation, to wordlines connected to gates of the memory cells of the selected memory cell block(s).

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
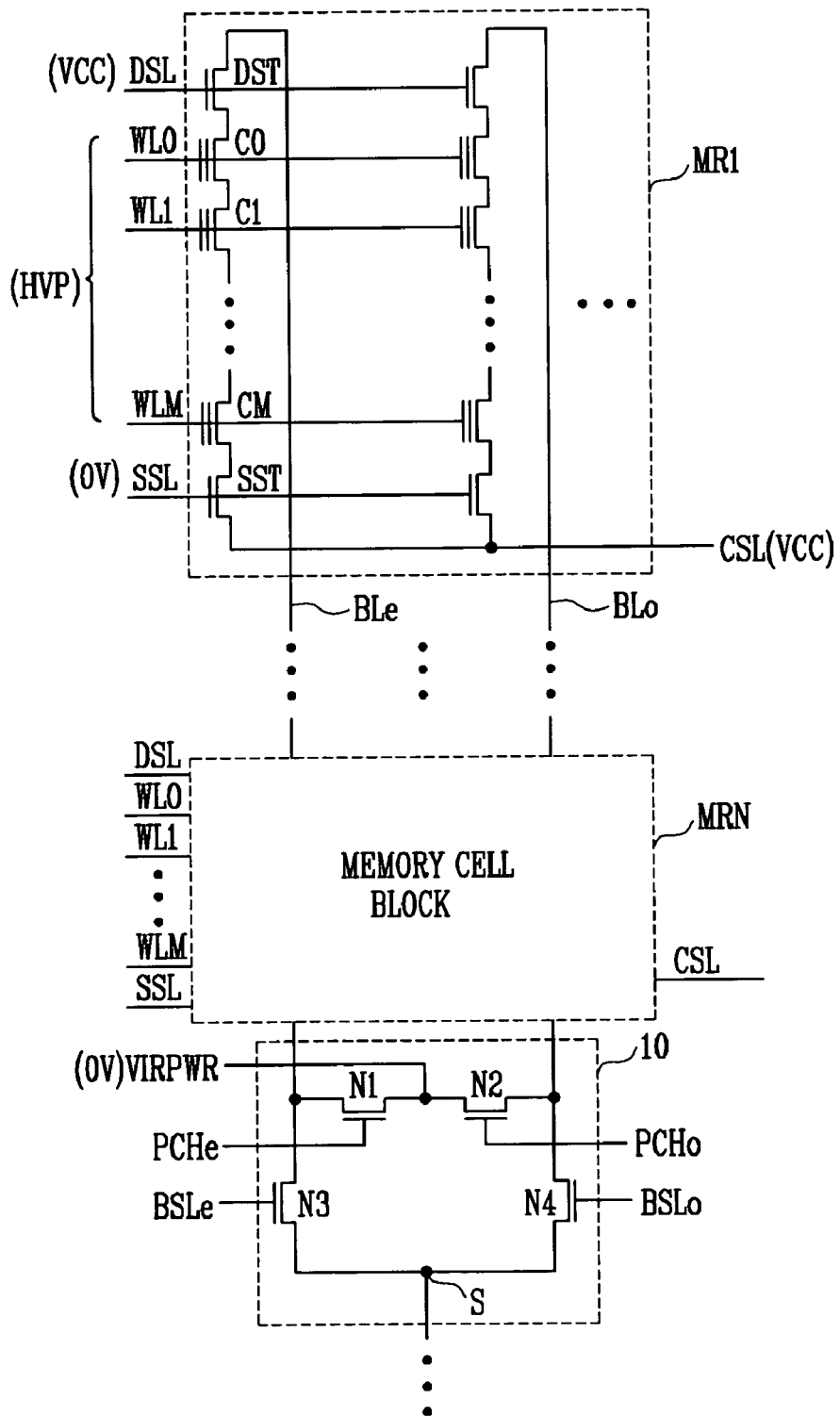
FIG. 1 is a circuit diagram illustrating memory cell blocks and bitline selection circuits, explaining a pre-program operation in a conventional flash memory device.
Figure 2:
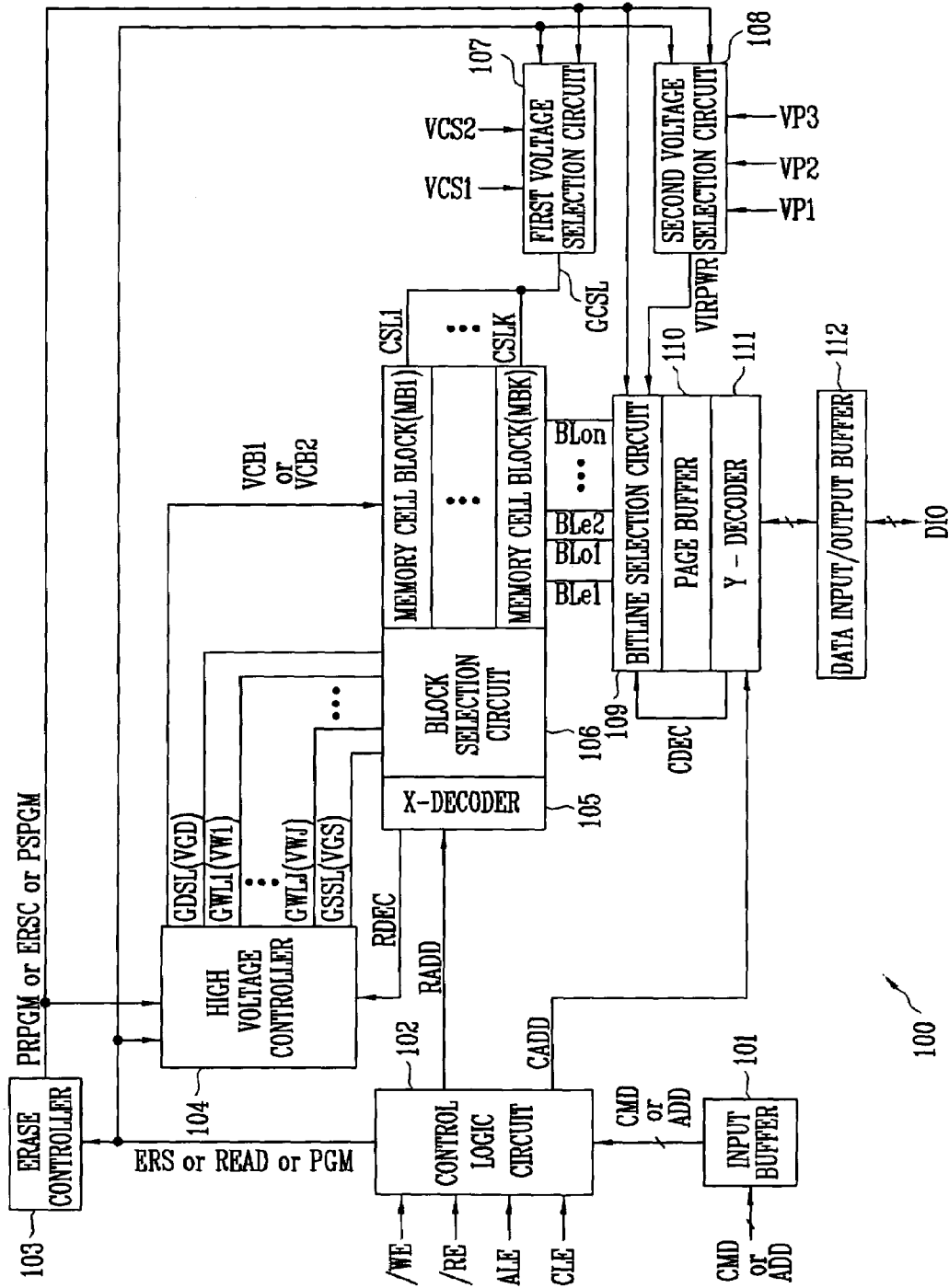
FIG. 2 is a block diagram illustrating a flash memory device in accordance with an embodiment of the present invention.

FIG. 2 is a block diagram illustrating a flash memory device in accordance with an embodiment of the present invention. Referring to FIG. 2, the flash memory device 100 is comprised of an input buffer 101, a control logic circuit 102, a device controller 103, a high voltage controller 104, memory cell blocks MB1~MBK (K is an integer), an X-decoder 105, a block selection circuit 106, a first voltage selection circuit 107, a second voltage selection circuit 108, a bitline selection circuit 109, a page buffer 110, a Y-decoder 111, and a data input/output buffer 112. The input buffer 101 receives a command signal CMD and an address signal ADD and then outputs them to the control logic circuit 102. The control logic circuit 102 receives the command signal CMD or the address signal ADD in response to external control signals/WE,/RE, ALE, and CLE. The control logic circuit 102 generates one among an erase command ERS, a read command READ, and a program command PGM in response to the command signal CMD. The control logic circuit 102 also generates row and column address signals, RADD and CADD, on basis of the address signals ADD.

The erase controller 103 generates one among a pre-program control signal PRPGM, an erase control signal ERSC, and a post-program control signal PSPGM in response to the erase command ERS. Alternatively, the flash memory device 100 may include a pre-program controller (not shown) instead of the erase controller 103, which generates the pre-program control signal PRPGM in response to the erase command ERS.

The high voltage generator 104 generates a drain selection line voltage VGD, a source selection line voltage VGS, and wordline bias voltages VW1~VWJ (J is an integer) in response to one among the pre-program control signal PRPGM, the erase control signal ERSC, and the post-program control signal PSPGM, or one of the read command READ and the program command PGM and a row decoding signal RDEC. Preferably, the high voltage generator 104 generates the drain selection line voltage VGD of the ground voltage level (i.e., 0V), the source selection line voltage VGS of a predetermined voltage (e.g., 0.5~10V), and the wordline bias voltages VW1~VWJ of a voltage level (15~20V) for programming in response to the pre-program control signal PRPGM and the post-program control signal PSPGM.

In addition, the high voltage generator 104 generates the drain selection line voltage VGD, the source selection voltage VGS, and the wordline bias voltages VW1~VWJ, of the ground voltage level (i.e., 0V), in response to the erase control signal ERSC. The high voltage generator 104 generates the drain and source selection line voltages VGD and VGS with a high voltage level (e.g., 4.5V), one group of the wordline bias voltages VW1~VWJ with the ground voltage level, and the other group of the wordline bias voltages in the high voltage level, responding to the read command READ and the row decoding signal RDEC. The high voltage generator 104 generates the drain selection line voltage VGD with the power source voltage level VCC, the source selection line voltage VGS with the ground voltage level, one group of the wordline bias voltages VW1~VWJ in a program voltage (e.g., 18V), and the rest of the wordline bias voltages in a pass voltage (e.g., 10V), responding to the program command PGM and the row decoding signal RDEC.

The high voltage generator 104 outputs the drain selection line voltage VGD, the source selection line voltage VGS, the wordline bias voltages VW1~VWJ to a global drain selection line GDSL, a global source selection line GSSL, and global wordlines GWL1~GWLJ (J is an integer). Further, the high voltage generator 104 generates one among bulk voltages VCB1 and VCB2 and applies the bulk voltage to the P-well of the memory cells of each memory cell block in response to one among the pre-program control signal PRPGM, the erase control signal ERSC, the post-program control signal PSPGM, the read command READ, and the program command PGM. Preferably, the high voltage generator 104 generates the bulk voltage VCB1 in response to the erase control signal ERSC, and generates the bulk voltage VCB2 in response to one among the pre-program control signal PRPGM, the post-program control signal PSPGM, the read command READ, and the program command PGM. The bulk voltage VCB1 is a high voltage (e.g., 20V) while the bulk voltage VCB2 is the ground voltage.

The X-decoder 105 decodes the row address signal RADD and outputs the row decoding signal RDEC. The block selection circuit 106 selects one or a part of the memory cell blocks MB1~MBK in response to the row decoding signal RDEC. The first voltage selection circuit 107 selects one of first and second common source voltages VCS1 and VCS2 and outputs the selected one to the global common source line GCSL, in response to one among the pre-program control signal PRPGM, the erase control signal ERSC, the post-program control signal PSPGM, the read command READ, and the program command PGM. Preferably, the first voltage selection circuit 107 selects the first common source voltage VCS1 in response to one among the pre-program control signal PSPGM, the erase control signal ERSC, the post-program control signal PSPGM, and the read command READ. Further, the first voltage selection circuit 107 selects the second common source voltage VCS2 in response to the program command PGM. The global common source line GCSL is connected to common source lines CSL1~CSLK of the memory cell blocks MB1~MBK.

The second voltage selection circuit 108 selects one of first through third voltages VP1~VP3 in response to one among the pre-program control signal PRPGM, the erase control signal ERSC, the post-program control signal PSPGM, the read command READ, and the program command PGM. Preferably, the second voltage selection circuit 108 selects the first voltage VP1 in response to one among the pre-program control signal PRPGM, the erase control signal ERSC, and the post-program control signal PSPGM. And, the second voltage selection circuit 108 selects the second voltage VP2 in response to the read command READ and selects the third voltage VP3 in response to the program command PGM.

The bitline selection circuit 109 applies the control voltage VIRPWR to a part or all of the bitlines BLe1~BLen and BLo1~BLon (n is an integer) shared by the memory cell blocks MB1~MBK, in response to the column decoding signal CDEC or one among the pre-program control signal PRPGM, the erase control signal ERSC, and the post-program control signal PSPGM. Further, the bitline selection circuit 109 connects or disconnects a part or all of the bitlines BLe1~BLen and BLo1~BLon with page buffer 110 in response to the column decoding signal CDEC or one among the pre-program control signal PRPGM, the erase control signal ERSC, and the post-program control signal PSPGM. Preferably, the bitline selection circuit 109 supplies the control voltage VIRPWR to all of the bitlines BLe1~BLen and BLo1~BLon and disconnects the all of the bitlines BLe1~BLen and BLo1~BLon from the page buffer 110, in response to the pre-program control signal PRPGM or the post-program control signal PSPGM. The structures and operation of the page buffer 110, the Y-decoder 111, and the data input/output buffer 112 are well known by those skilled in the art, so it will not be described.

Figure 3:
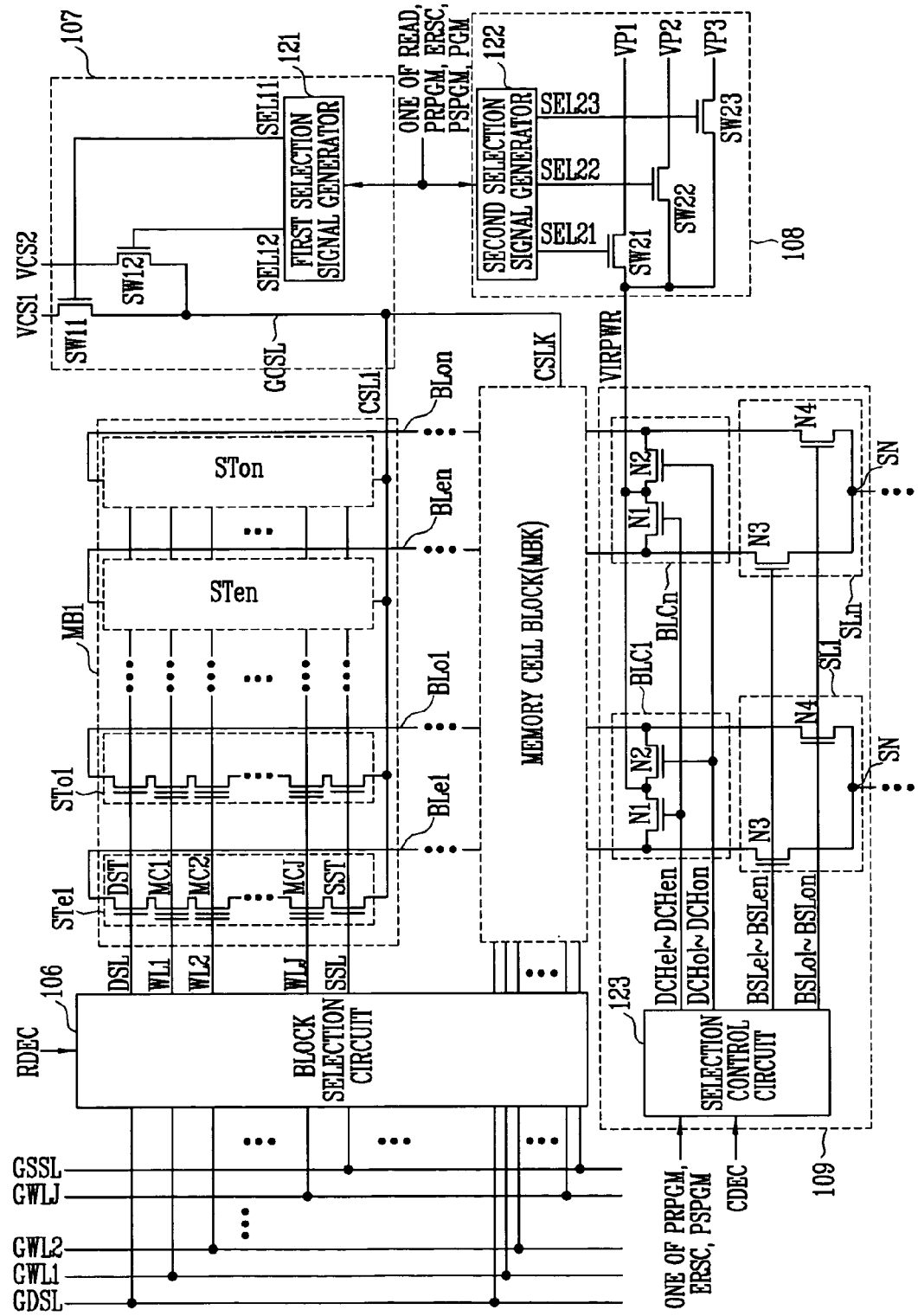
FIG. 3 is a detailed circuit diagram illustrating memory cell blocks, a block selection circuit, a bitline selection circuit, a first voltage selection circuit, and a second voltage selection circuit, those shown in FIG. 2.

FIG. 3 is a detailed circuit diagram illustrating the memory cell blocks, the block selection circuit, the bitline selection circuit, the first voltage selection circuit, and the second voltage selection circuit, from those shown in FIG. 2. Each of the memory cell blocks MB1~MBK includes the wordlines WL1~WLJ, the bitlines BLe1~BLen and BLo1~BLon, and memory cells MC1~MCJ (J is an integer) sharing the common source line (one of CSL1~CSLK). The structures and operations of the memory cell blocks MB1~MBK are similar to each other, so it will be described with respect to those of the memory cell block MB1 as a representative. The memory cell blocks MB1 includes pluralities of cell strings STe1~STen and STo1~STon. Each of the cell strings STe1~STen and STo1~STon includes the drain selection transistor DST, the memory cells MC1~MCJ and the source selection transistor SST. The memory cells MC1~MCJ are connected in series and the drain selection transistors DST is connected between the bitline BLe1 and the drain of the memory cell MC1. The source selection transistor SST is connected between the common source line CSL1 and the source of the memory cell MCJ. The gates of the drain selection transistors DST of the cell strings STe1~STen and STo1~STon are connected to the drain selection line DSL, and the drains are connected to the bitlines BLe1~BLen and BLo1~BLon. The gates of the memory cells MC1~MCJ of the cell strings STe1~STen and STo1~STon are coupled to the wordlines WL1~WLJ. The gates of the source transistors SST of the cell strings STe1~STen and STo1~STon are coupled to the source selection line SSL, and the sources are connected to the common source line CSL1.

The block selection circuit 106 is connected with the drain selection lines DSL of the memory cell blocks MB1~MBK, the wordlines WL1~WLJ, the source selection lines SSL, the global selection line GDSL, the global wordlines GWL1~GWLJ, and the global source line GSSL. The block selection circuit 106 selects one of a part of the memory cell blocks MB1~MBK in response to the row decoding signal RDEC. The block selection circuit 106 connects the drain selection line(s) DSL of the selected memory cell block(s) to the global drain selection line GDSL, connects the source selection line(s) SSL of the selected memory cell block(s) to the global source selection line GSSL, and connects the wordlines WL1~WLJ of the selected memory cell block(s) each to the global wordlines GWL1~GWLJ.

The first voltage selection circuit 107 is comprised of a first selection signal generator 121 and switches SW11 and SW12. The first selection signal generator 121 generates selection signals SEL11 and SEL12 in response to one among the read command READ, the pre-program control signal PRPGM, the erase control program ERSC, the post-program control signal PSPGM, and the program command PGM. Preferably, the first selection signal generator 121 enables the selection signal SEL11 but disables the selection signal SEL12, in response to one among the read command READ, the pre-program control signal PRPGM, the erase control program ERSC, and the post-program control signal PSPGM. Further, the first selection signal generator 121 enables the selection signal SEL12 but disables the selection signal SEL11, in response to the program command PGM. The switches SW11 and SW12 may be implemented with NMOS transistors. The switch SW11 is connected between the first common source voltage VCS1 and the global source line GCSL, being turned on or off in response to the selection signal SEL11. The switch SW12 is connected between the second common source voltage VCS2 and the global source line GCSL, being turned on of off in response to the selection signal SEL12. The global source line GCSL is connected to the common source lines CSL1~CSLK of the memory cell blocks MB1~MBK. Preferably, the first common source voltage VCS1 may be set on the ground voltage (i.e., 0V) and the second common source voltage VCS2 may be set on the power source voltage VCC.

The second voltage selection circuit 108 is comprised of a second selection signal generator 122 and switches SW21, SW22 and SW23. The second selection signal generator 122 generates selection signals SEL21, SEL22, and SEL23 in response to one among the read command READ, the pre-program control signal PRPGM, the erase control program ERSC, the post-program control signal PSPGM, and the program command PGM. Preferably, the second selection signal generator 122 enables the selection signal SEL21 but disables the selection signals SEL22 and SEL23, in response to one among the pre-program control signal PRPGM or the post-program control signal PSPGM. Further, the second selection signal generator 122 enables the selection signal SEL22 but disables the selection signals SEL21 and SEL23, in response to the read command READ or the erase control signal ERSC. Further, the second selection signal generator 122 enables the selection signal SEL23 but disables the selection signals SEL21 and SEL22, in response to the program command READ.

The switch SW21 is connected between the first voltage VP1 and the bitline selection circuit 109, being turned on or off in response to the selection signal SEL21. When the switch SW21 is turned on, the first voltage VP1 is applied to the bitline selection circuit 109 as the control voltage VIRPWR. The switch SW22 is connected between the second voltage VP2 and the bitline selection circuit 109, being turned on or off in response to the selection signal SEL22. When the switch SW22 is turned on, the second voltage VP2 is applied to the bitline selection circuit 109 as the control voltage VIRPWR. The switch SW23 is connected between the third voltage VP3 and the bitline selection circuit 109, being turned on or off in response to the selection signal SEL23. When the switch SW23 is turned on, the third voltage VP3 is applied to the bitline selection circuit 109 as the control voltage VIWR. Preferably, the first voltage VP1 may be set on the ground voltage or a positive voltage lower than the power source voltage VCC. The second voltage VP2 may be set on the ground voltage, and the third voltage VP3 may be set on the power source voltage VCC.

The bitline selection circuit 109 is comprised of a selection control circuit 123, bitline control circuits BLC1~BLCn (n is an integer), and bitline selection circuits SL1~SLn (n is an integer). The selection control circuit 123 generates bitline control signals DCHe1~DCHen and DCHo1~DCHon and bitline selection signals BSLe1~BSLen and BSLo1~BSLon in response to one the column decoding signal CDEC or one among the pre-program control signal PRPGM, the erase control signal ERSC, and the post-program control signal PSPGM. Preferably, the selection control circuit 123 partially enables the bitline control and selection signals, DCHe1~DCHen and DCHo1~DCHon, and BSLe1~BSLon and BSLo1~BSLon, in response to the column decoding signal CDEC. As a result, the control voltage VIRPWR is partially supplied to the bitlines BLe1~BLen and BLo1~BLon. The bitlines among Ble1~BLen and BLo1~BLon, which are supplied with the control voltage VIRPWR, are connected to the page buffer 110 (refer to FIG. 2).

The selection control circuit 123 enables all the bitline control signals DCHe1~DCHen and DCHo1~DCHon but disables all the bitline selection signals BSLe1~BSLen and BSLo1~BSLon, in response to one among the pre-program control signal PRPGM, the erase control signal ERSC, and the post-program control signal PSPGM. As a result, the control voltage VIRPWR is applied to all the bitlines BLe1~BLen and BLo1~BLon, and the bitlines BLe1~BLen and BLo1~BLon are isolated from the page buffer 110.

The bitline control circuits BLC1~BLCn supply the control voltage VIRPWR to a part or all of the bitlines BLe1~BLen and BLo1~BLon in response to the bitline control signals DCHe1~DCHen and DCHo1~DCHon. As the structures and operations of the bitline control circuits BLC1~BLCn are similar to each other, it will be described through the bitline control circuit BLC1 as an example. The bitline control circuit BLC1 is comprised of NMOS transistors N1 and N2. The drain and source of the NMOS transistor N1 are connected each to the bitline BLe1 and the control voltage VIRPWR, and the gate thereof is supplied with the bitline control signal DCHe1. The NMOS transistor N1 is turned on or off in response to the bitline control signal DCHe1. Preferably, when the bitline control signal DCHe1 is enabled, the NMOS transistor N1 is turned on to precharge the bitline BLe1 to the level of the control voltage VIRPWR.

The drain and source of the NMOS transistor N2 are connected each to the bitline BLo1 and the control voltage VIRPWR, and the gate thereof is supplied with the bitline control signal DCHo1. The NMOS transistor N2 is turned on or off in response to the bitline control signal DCHo1. Preferably, when the bitline control signal DCHo1 is enabled, the NMOS transistor N2 is turned on to precharge the bitline BLo1 to the level of the control voltage VIRPWR.

The selection circuits SL1~SLn connects or disconnects the bitlines BLe1~BLen and BLo1~BLon partially or entirely with the page buffer 10 in response to the bitline selection signals BSLe1~BSLen and BSLo1~BSLon. As the structures and operations of the bitline selection circuits SL1~SLn are similar to each other, it will be described through the bitline selection circuit SL1 as an example. The bitline selection circuit SL1 is comprised of NMOS transistors N3 and N4. The drain and source of the NMOS transistor N3 are connected each to the bitline BLe1 and a sensing node SN, and the gate thereof is supplied with the bitline selection signal BSLe1. The sensing node SN is connected to the page buffer 110. The NMOS transistor N3 is turned on or off in response to the bitline selection signal BSLe1. Preferably, when the bitline selection signal BSLe1 is enabled, the NMOS transistor N3 is turned on to connect the bitline BLe1 to the sensing node SN. As a result, the bitline BLe1 is connected to the page buffer 110. The drain and source of the NMOS transistor N4 are connected each to the bitline BLo1 and the sensing node SN, and the gate thereof is supplied with the bitline selection signal BSLo1. The NMOS transistor N4 is turned on or off in response to the bitline selection signal BSLo1. Preferably, when the bitline selection signal BSlo1 is enabled, the NMOS transistor N4 is turned on to connect the bitline BLo1 to the sensing node SN. As a result, the bitline BLo1 is connected to the page buffer 110.

Now, it will be described about the pre-program operation of the flash memory device 100 in more detail. First, the control logic circuit 102 generates the erase command ERS in response to the command signal CMD and the external control signals/WE,/RE, ALE, and CLE, and generates the row address signal RADD with reference to the address signal. The erase controller 103 generates the pre-program control signal PRPGM in response to the erase command ERS. Responding to the pre-program control signal PRPGM, the high voltage generator 104 generates the drain selection line voltage VGD, the source selection line voltage VGS, and the wordline bias voltages VW1~VWJ. While this, the high voltage generator 104 outputs the drain selection line voltage VGD with the ground voltage level and outputs the source selection line voltage VGS with a voltage level higher than the drain selection line voltage VGD. For instance, the source selection line voltage VGS may be set on a voltage in the range of 0.5~10V. The high voltage generator 104 also outputs the wordline bias voltages VW1~VWJ with a voltage level (e.g., 15~20V) for the pre-program operation. The high voltage generator 104 applies the drain selection line voltage VGD to the global drain selection line GDSL and applies the source selection line voltage VGS to the global source selection line GSSL. Further, the high voltage generator 104 applies the wordline bias voltages VW1~VWJ each to the global wordlines GWL1~GWLJ.

The X-decoder 105 decodes the row address signal RADD and outputs the row decoding signal RDEC. The block selection circuit 106 selects one or a part of the memory cell blocks MB1~MBK in response to the row decoding circuit RDEC. For instance, when the block selection circuit 106 selects the memory cell block MB1, it connects the drain selection line DSL of the memory cell block MB1 to the global drain selection line GDSL, the source selection line SSL of the memory cell block MB1 to the global source selection line GSSL, and the wordlines WL1~WLJ each to the global wordlines GWL1~GWLJ. As a result, the drain selection line voltage VGD, the source selection line voltage VGS, the wordline bias voltages VW1~VWJ are applied to the drain selection line DSL, the source selection line SSL, and the wordlines WL1~WLJ, respectively. The drain selection transistors DST of the memory cell block MB1 are turned off in response to the drain selection line voltage VGD, so that the memory cells MC1~MCJ of each of the cell strings STe1~STen and STo1~STon are isolated from the bitlines BLe1~BLen and BLo1~BLon. And, as the source selection transistors SST of the memory cell block MB1 are turned on in response to the source selection line voltage VGS, the memory cells MC1~MCJ of each of the cell strings STe1~STen and STo1~STon are connected to the common source line CSL1. The wordline bias voltages VW1~VWJ are applied to the gates of the memory cells MC1~MCJ of each of the cell strings STe1~STen and STo1~STon. Meanwhile, the block selection circuits 106 isolates the drain selection line DSL, the source selection line SSL, and the wordlines WL1~WLJ from the global drain selection line GDSL, the global source selection line GSSL, and the global wordlines GWL1~GWLJ.

The first voltage selection circuit 107 selects the first common source voltage VCS1 of the ground voltage level in response to the pre-program control signal PRPGM, and applies the first common source voltage VCS1 to the global source line GCSL connected to the common source line CSL1. Referring to FIG. 3, the first selection signal generator 121 enables the selection signal SEL11 and disables the selection signal SEL12, in response to the pre-program control signal PRPGM. As a result, the switch SW11 is turned on to supply the first common source voltage VCS1 to the global source line GCSL and the switch SW12 is turned off. Thus, the first common source voltage VCS1 of the ground voltage level is applied to the common source line CSL1.

The second voltage selection circuit 108 selects the first voltage VP1, which has the ground voltage level, or a positive voltage level lower than the power source voltage VCC, in response to the pre-program control signal PRPGM, and applies the first voltage VP1 to the bitline control circuits BLC 1~BLCn of the bitline selection circuit 109 as the control voltage VIRPWR.

The selection control circuit 123 of the bitline selection circuit 109 enable all the bitline control signals DCHe1~DCHen and DCHo1~DCHon but disable all the bitline selection signals BSLe1~BSLen and BSLo1~BSLon, in response to the pre-program control signal PRPGM. The bitline control circuits BLC1~BLCn supply the control voltage VIRPWR to the bitlines BLe1~BLen and BLo1~BLon in response to the bitline control signals DCHe1~DCHen and DCHo1~DCHon. As a result, the bitlines BLe1~BLen and BLo1~BLon are precharged to the control voltage VIRPWR. And, responding to the bitline selection signals BSLe1~BSLen and BSLo1~BSLon, the bitline selection circuits SL1~SLn isolate the bitlines BLe1~BLen and BLo1~BLon from the page buffer 110. Thus, the memory cells MC1~MCJ of the memory cell block MB1 are programmed at the same time, while the memory cells of the rest memory cell blocks MB2~MBK are prohibited from being programmed.

Figure 4:
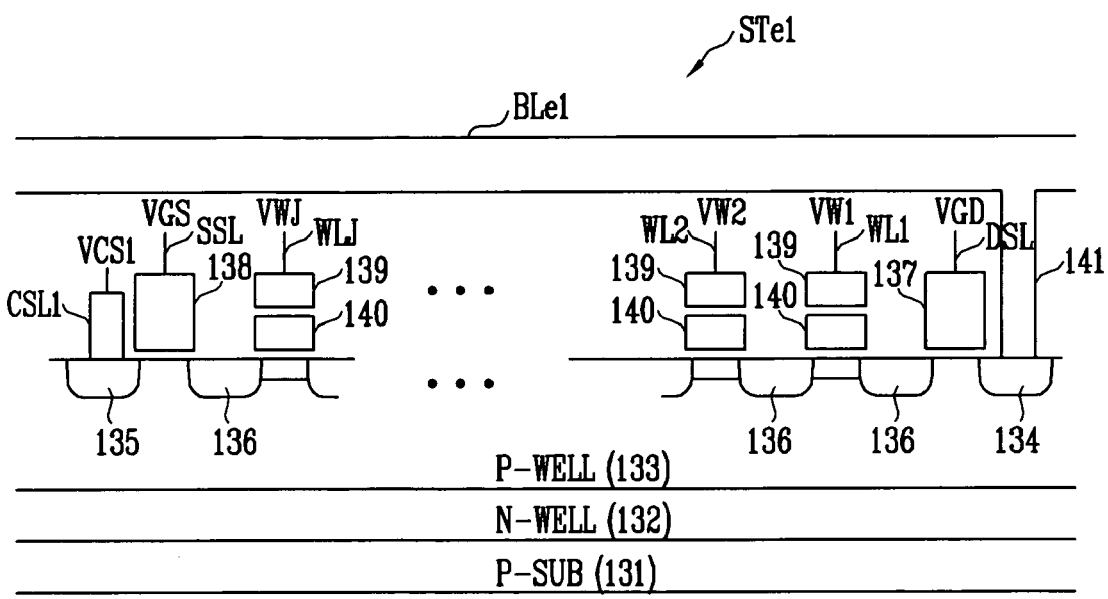
FIG. 4 is a sectional diagram illustrating a cell string shown in FIG. 3.

FIG. 4 illustrates the cell string STe1 of the memory cell block MB1. Referring to FIG. 4, after forming an N-well 132 and an P-well 133 in a substrate 131, a drain region 134, a source region 135, and pluralities of impurity regions 136 are formed in the P-well 133. The drain region 134 is connected to the bitline BLe1 through a drain contact 141, and the source region 135 is connected to the common source line CSL1. Control gates 139 of the memory cells MC1~MCJ are connected to the wordline bias voltages VW1~VWJ of the voltage 15~20V for the pre-program operation. The gate 137 of the drain selection transistor DST is coupled to the drain selection line DSL, and supplied with the drain selection line voltage VGD of the ground voltage level through the drain selection line DSL. Thus, the drain selection transistor DST is turned off. The gate 138 of the source selection transistor SST is connected to the source selection line SSL, supplied with the source selection line voltage VGS of the voltage 0.5~10V through the source selection line SSL. Thus, the source selection transistor SST is turned on. As a result, by the source selection transistor SST, the first common source voltage VCS1 of the ground voltage level applied to the common source line CS1 is transferred to the memory cells MC1~MCJ. During this, the common source line CS1 is connected only to the memory cell block MB1, not to all the memory cell blocks MB1~MBK. Comparative to this, the bitline BLe1 is shared by the memory cell blocks MB1~MBK. Thus, the loading capacitance of the common source line CSL1 is much lower than that of the bitline BLe1. From this reason, the common source line CSL1 is able to be discharged to the ground voltage level faster than the bitline BLe1. And, since the common source line CSL1 does not cross the wordlines W11~WLJ, the common source line CSL can be quickly discharged to the ground voltage level without affecting the wordline bias voltages VW1~VWJ. But, during the pre-program operation, the ground voltage may not be quickly transferred to the memory cells MC1~MCJ due to the large loading capacitance of the bitline BLe1 and the drain contact 141 when the ground voltage is transferred to the memory cells MC1~MCJ through the bitline BLe1 and the drain contact 141. Further, when the ground voltage is transferred to the memory cells MC1~MCJ through the bitline BLe1, the bitline BLe1 is affected from the wordline bias voltages VW1~VWJ applied to the wordlines WL1~WLK fabricated under the bitline BLe1. As a result, it takes a longer time for discharging the bitline BLe1 to the ground voltage level. Therefore, it is possible to reduce the pre-program time and current consumption in supplying the ground voltage to the memory cells MC1~MCJ through the bitline BLe1 more than through the common source line CSL1.

Figure 5:
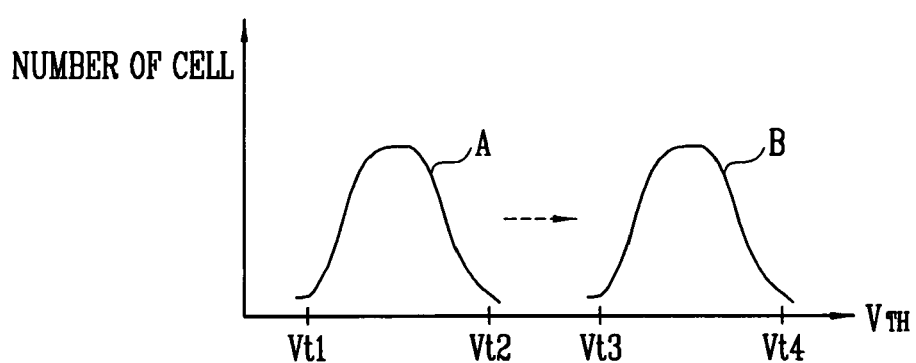
FIG. 5 is a graphic diagram showing a distribution profile of threshold voltages of memory cells by the pre-program operation of the flash memory device according to the present invention.

FIG. 5 is a graphic diagram showing a distribution profile of threshold voltages of memory cells by the pre-program operation of the flash memory device according to the present invention. Referring to FIG. 5, the curve A plots the distribution profile of the threshold voltage $V_{TH}$ of the memory cells before the pre-program operation, being in the range Vt1~Vt2. The curve B plots the distribution profile of the threshold voltage $V_{TH}$ of the memory cells after the pre-program operation, being in the range Vt3~Vt4. The voltage range Vt3~Vt4 is an ideal range capable of preventing the threshold voltages of the memory cells from being lowered excessively when the memory cells are being erased. As illustrated by the broken arrow, the threshold voltages of the memory cells of the memory cell block to be erased by the pre-program operation in the flash memory device 100 are distributed within the ideal voltage range.

The present invention shortens a pre-program time and reduces current consumption by separating bitlines from memory cells and applying program bias voltages through the common source line Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A flash memory device comprising:
   memory cell blocks each including wordlines, bitlines, and memory cells sharing common source lines;
   an erase controller configured to generate a pre-program control signal in response to an erase command; and
   a voltage selection circuit configured to select one of first and second common source voltages in response to one among the pre-program control signal, a read command, and a program command and output the selected voltage to a global common source line,
   wherein the global common source line is connected to the common source line of each of the memory cell blocks, and
   wherein the memory cells of the memory cell block in a pre-program operation are isolated from the bitlines but connected to the common source line, and wordline bias voltages are applied to the wordlines of the memory cells for the pre-program operation.

2. The flash memory device as set forth in claim 1, wherein the erase controller further generates an erase control signal and a post-program control signal in response to the erase command.

3. The flash memory device as set forth in claim 2, further comprising:
   an X-decoder configured to decode a row address signal and outputting a row decoding signal;
   a high voltage generator configured to generate a drain selection voltage, a source selection voltage, and wordline bias voltages in response to the row decoding signal and one among the read command, the program command, the pre-program control signal, the erase control signal, and the post-program control signal, and output the drain selection line voltage to a global drain selection line, the source selection line voltage to a global source selection line, and the wordline bias voltages to global wordlines; and
   a block selection circuit configured to select one or a portion of the memory cell blocks in response to the row decoding signal, and connect drain selection line of at least one selected memory cell block to the global drain selection line, a source selection line of at least one selected memory cell block to the global source selection line, and a wordline of at least one selected memory cell block to the global wordlines, respectively.

4. The flash memory device as set forth in claim 3, wherein the high voltage generator outputs the drain selection line voltage as a first voltage level and outputs the source selection line voltage as a second voltage level, in response to the pre-program control signal; and
   wherein the second voltage is higher than the first voltage and the first voltage is a ground voltage.

5. The flash memory device as set forth in claim 1, wherein the voltage selection circuit selects the first common source voltage in response to the read command or the pre-program control signal, and selects the second common source voltage in response to the program command; and
   wherein the first common source voltage is a ground voltage and the second common source voltage is a power source voltage.

6. The flash memory device as set forth in claim 1, wherein the voltage selection circuit comprises:
   a selection signal generator generating first and second selection signals in response to one among the read command, the pre-program control signal, and the program command;
   a first switch provided between the first common source voltage and the global common source line and configured to turn on or off in response to the first selection signal; and
   a second switch provided between the second common source voltage and the global common source line and configured to turn on or off in response to the second selection signal.

7. The flash memory device as set forth in claim 2, wherein the voltage selection circuit selects the first common source voltage in response to one among the read command, the pre-program control signal, the erase control signal, and the post-program control signal, and selects the second common source voltage in response to the program command; and
   wherein the first common source voltage is a ground voltage and the second common source voltage is a power source voltage.

8. The flash memory device as set forth in claim 7, wherein the voltage selection circuit comprises:
   a selection signal generator generating first and second selection signals in response to one among the read command, the post-program control signal, and the program command;
   a first switch connected between the first common source voltage and the global common source line and configured to turn on or off in response to the first selection signal; and
   a second switch connected between the second common source voltage and the global common source line and configured to turn on or off in response to the second selection signal.

9. The flash memory device as set forth in claim 1, further comprising:
   a Y-decoder configured to decode a column address signal and output a column decoding signal;
   an additional voltage selection circuit configured to select one of first through third voltages in response to one among the pre-program control signal, the read command, and the program command, and output the selected voltage as a control voltage; and
   a bitline selection circuit configured to supply the control voltage to the bitlines partially or entirely and connect the bit lines partially or entirely to a page buffer, in response to the column decoding signal or the pre-program control signal.

10. The flash memory device as set forth in claim 9, wherein the additional voltage selection circuit selects the first, second, and third voltages in response to the pre-program control signal, the read command, and the program command, respectively; and
    wherein the first voltage is a ground voltage or a positive voltage lower than a power source voltage, the second voltage is the ground voltage, and the third voltage is the power source voltage.

11. The flash memory device as set forth in claim 9, wherein the bitline selection circuit comprises:
a selection control circuit configured to output bitline control signals and bitline selection signals in response to the column decoding signal or the pre-program control signal;
bitline control circuits configured to supply the control voltage to the bitlines partially or entirely in response to the bitline control signals; and
bitline selection circuits configured to connect or disconnect ethe bitlines partially or entirely to a page buffer in response to the bitline selection signals.

12. The flash memory device as set forth in claim 11, wherein the additional voltage selection circuit comprises:
a selection signal generator configured to generate first through third selection signals in response to one among the pre-program control signal, the read command, and the program command;
a first switch provided between the first voltage and the bitline control circuits and configured to turn on or off in response to the first signal;
a second switch provided between the second voltage and the bitline control circuits and configured to turn on or off in response to the second signal; and
a third switch provided between the third voltage and the bitline control circuits and configured to turn on or off in response to the third signal.

13. The flash memory device as set forth in claim 2, further comprising:
a Y-decoder configured to decode a column address signal and outputting a column decoding signal;
an additional voltage selection circuit configured to select one of first and second voltages in response to one among the pre-program control signal, the erase control signal, the post-program control signal, the read command, and the program command, and output the selected voltage as a control voltage; and
a bitline selection circuit configured to supply the control voltage to the bitlines partially or entirely and connect the bitlines partially or entirely to a page buffer, in response to the column decoding signal or one among the pre-program control signal, the erase control signal, and the post-program control signal.

14. The flash memory device as set forth in claim 13, wherein the additional voltage selection circuit selects the first voltage in response to the pre-program control signal or the post-program control signal, selects the second voltages in response to the erase control signal, and selects the third voltage in response to the third voltage; and
wherein the first voltage is a ground voltage or a positive voltage lower than a power source voltage, the second voltage is the ground voltage, and the third voltage is the power source voltage.

15. The flash memory device as set forth in claim 13, wherein the additional voltage selection circuit comprises:
a selection signal generator configured to generate first through third selection signals in response to one among the pre-program control signal, the erase control signal, the post-program control signal, the read command, and the program command;
a first switch provided between the first voltage and the bitline control circuits and configured to turn on or off in response to the first signal;
a second switch provided between the second voltage and the bitline control circuits and configured to turn on or off in response to the second signal; and
a third switch provided between the third voltage and the bitline control circuits and configured to turn on or off in response to the third signal.

16. A method for controlling a pre-program operation of a flash memory device, the method comprising:
generating a pre-program control signal in response to an erase command;
supplying a common source voltage of a ground voltage level to a global common source line coupled to a common source line of each of memory cell blocks, the common source voltage being supplied in response to the pre-program control signal;
selecting one or a portion of the memory cell blocks in response to a row address signal;
connecting memory cells of the at least one selected memory cell block to the common source line from bitlines; and
supplying wordline bias voltages for a pre-program operation to wordlines connected to gates of the memory cells of the at least one selected memory cell block.

17. The method as set forth in claim 16, wherein the supplying-the-common-source-voltage step comprises:
generating selection signals in response to the pre-program control signal; and
selecting and outputting the ground voltage to the global common source line as the common source voltage in response to the selection signals.

18. The method as set forth in claim 16, further comprising: precharging the bitlines to a control voltage level in response to the pre-program control signal.

19. The method as set forth in claim 18, wherein the control voltage is the ground voltage or a positive voltage lower than a power source voltage.

20. The method as set forth in claim 18, wherein the precharging step comprises:
selecting and outputting the ground voltage or a positive voltage lower than a power source voltage as the control voltage in response to the pre-program control signal;
enabling a plurality of bitline control signals and disabling a plurality of bitline selection signals, in response to the pre-program control signal;
supplying the control voltage to the bitlines in response to the bitline control signals; and
isolating the bitlines from a page buffer in response to the bitline selection signals.

* * * * *